United States Patent
Kostrzewa et al.

(10) Patent No.: US 9,102,776 B1
(45) Date of Patent: Aug. 11, 2015

(54) DETECTION AND MITIGATION OF BURN-IN FOR THERMAL IMAGING SYSTEMS

(75) Inventors: Joseph Kostrzewa, Buellton, CA (US); Leonard Araki, Goleta, CA (US); Russell D. Grannemann, Goleta, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 645 days.

(21) Appl. No.: 13/411,996

(22) Filed: Mar. 5, 2012

(51) Int. Cl.
*C08F 265/04* (2006.01)
*G01R 31/28* (2006.01)

(52) U.S. Cl.
CPC .......... *C08F 265/04* (2013.01); *B41M 2205/06* (2013.01); *G01R 31/2865* (2013.01)

(58) Field of Classification Search
CPC ...................... B41M 2205/02; B41M 2205/06; B41M 5/52; B41M 5/5227; B41M 5/5254; B41M 5/5281; C08F 265/04; G01R 31/2865; G01R 31/2863; G01R 31/2877
USPC ................ 348/164; 382/103; 427/395, 385.5; 324/763.01, 762.01, 750.09, 756.02, 324/750.05
See application file for complete search history.

(56) References Cited

U.S. PATENT DOCUMENTS

| | | | |
|---|---|---|---|
| 6,028,309 A | 2/2000 | Parrish et al. | |
| 6,700,108 B2 * | 3/2004 | Livingston | 250/203.1 |
| 8,373,757 B1 * | 2/2013 | Nguyen | 348/164 |
| 8,755,597 B1 * | 6/2014 | Tantalo et al. | 382/162 |
| 2004/0207836 A1 * | 10/2004 | Chhibber et al. | 356/237.4 |
| 2006/0219920 A1 * | 10/2006 | Wijk et al. | 250/332 |
| 2007/0177019 A1 * | 8/2007 | Reichenbach et al. | 348/207.99 |
| 2008/0056606 A1 * | 3/2008 | Kilgore | 382/275 |
| 2011/0299826 A1 * | 12/2011 | Weisbach | 386/227 |
| 2013/0147966 A1 * | 6/2013 | Kostrzewa et al. | 348/164 |

* cited by examiner

*Primary Examiner* — Behrooz Senfi
(74) *Attorney, Agent, or Firm* — Haynes and Boone, LLP

(57) ABSTRACT

Various techniques are disclosed to detect and mitigate the effects of burn-in events occurring in thermal imaging systems. Such events may be attributable to the sun (e.g., solar burn-in) and/or other high thermal energy sources. In one example, a method includes detecting a burn-in event that causes thermal images captured by a focal plane array (FPA) to exhibit a blemish; and mitigating the blemish in the thermal images. In another example, a thermal imaging system includes a focal plane array (FPA) adapted to capture thermal images; and a processor adapted to: detect a burn-in event that causes the thermal images to exhibit a blemish, and mitigate the blemish in the thermal images.

22 Claims, 10 Drawing Sheets

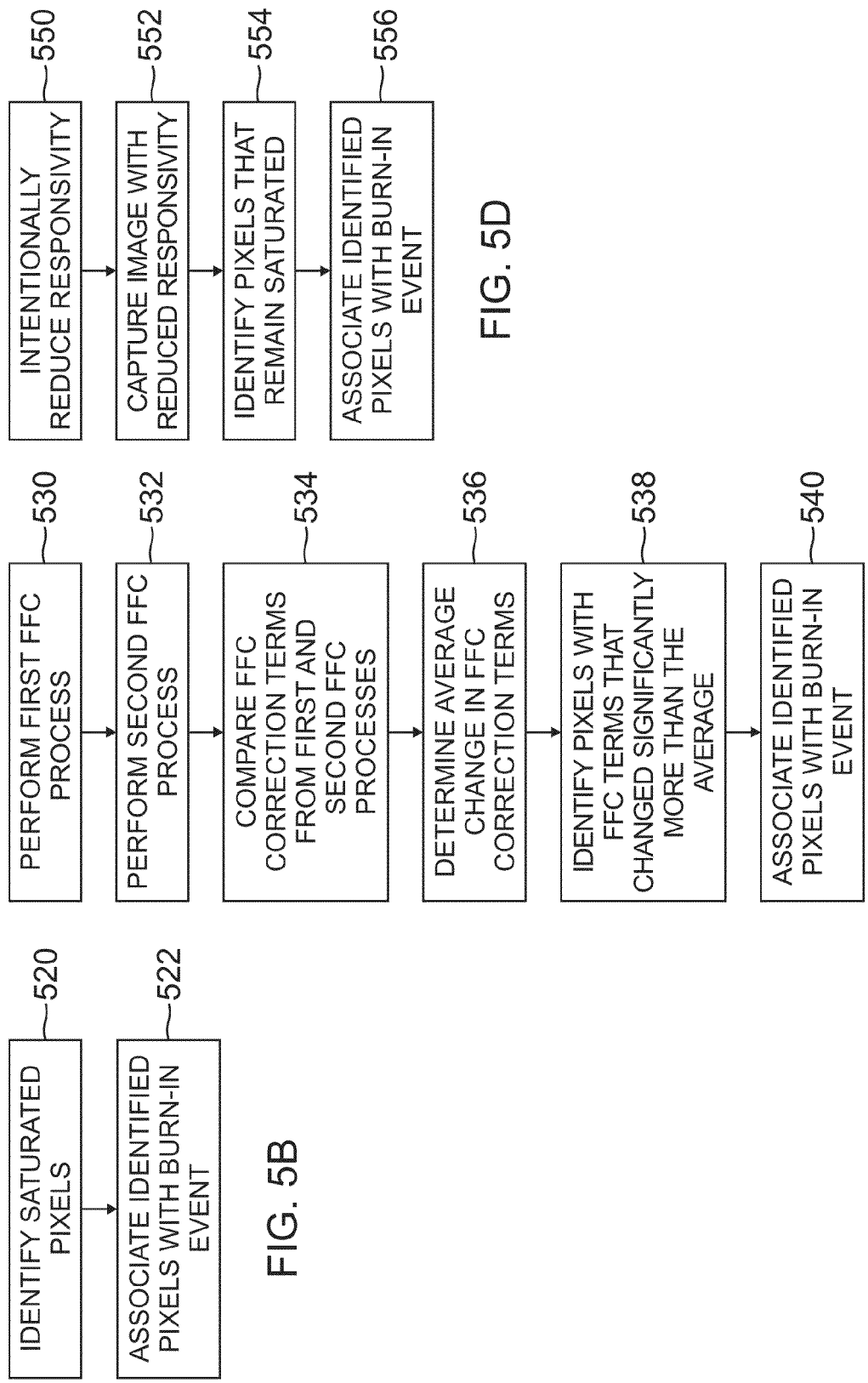

US 9,102,776 B1

DETECTION AND MITIGATION OF BURN-IN FOR THERMAL IMAGING SYSTEMS

TECHNICAL FIELD

One or more embodiments of the invention relate generally to thermal imaging systems and more particularly, for example, to reducing the effects of burn-in events for thermal imaging systems.

BACKGROUND

As is well known, thermal imaging systems such as thermal cameras and the like are often implemented with focal plane arrays (FPAs) to detect and capture thermal images from a scene. However, high intensity thermal energy sources (e.g., the sun or other sources) are often problematic for such devices.

In this regard, an intense energy source in the target scene may cause portions of the FPA to become saturated. If the energy source is sufficiently intense, a "burn-in" event may occur wherein affected portions of the FPA remain highly saturated even as subsequent thermal images are captured. This can result in one or more blemishes (e.g., streaks or hot spots) remaining present in the additional thermal images, even after the energy source is removed from the scene.

Existing techniques to mitigate the effects of burn-in events are often unsatisfactory in practice. In one approach, shielding in the form of coatings or filters may be used to protect thermal imaging systems from high intensity energy. However, such shielding often fails to completely eliminate burn-in due to both in-band and/or out-of-band irradiance. In addition, such shielding typically entails a non-trivial cost and may reduce in-band transmission unsatisfactorily.

In another approach, a periodic flat-field correction (FFC) process may be performed in which an FPA is exposed to a uniform scene (e.g., a shutter or other controlled scene), to determine correction terms that generate a uniform output. By applying the FFC terms, the blemishes may be temporarily compensated in subsequent thermal images.

However, as affected portions of the FPA gradually decay to their normal operating states, the magnitude of the offset difference between affected and unaffected portions of the FPA will change over time in the captured thermal images. Moreover, the decay rate is typically non-linear and variable (e.g., ranging from minutes to months depending on detector properties, magnitude of irradiance, exposure time, and other variables). As a result, the blemishes will reappear between periodic FFC processes (e.g., typically as an inverse/negative "dark" blemish) due to overcompensation by the correction terms. Consequently, periodic FFC is also an unsatisfactory mitigation approach.

SUMMARY

Various techniques are disclosed to detect and mitigate the effects of burn-in events occurring in thermal imaging systems. Such events may be attributable to the sun (e.g., solar burn-in) and/or other high thermal energy sources.

In one embodiment, a method includes detecting a burn-in event that causes thermal images captured by a focal plane array (FPA) to exhibit a blemish; and mitigating the blemish in the thermal images.

In another embodiment, a thermal imaging system includes a focal plane array (FPA) adapted to capture thermal images; and a processor adapted to: detect a burn-in event that causes the thermal images to exhibit a blemish, and mitigate the blemish in the thermal images.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 5B-D illustrate several processes of detecting burn-in events in accordance with embodiments of the disclosure.

Embodiments of the invention and their advantages are best understood by referring to the detailed description that follows. It should be appreciated that like reference numerals are used to identify like elements illustrated in one or more of the figures.

DETAILED DESCRIPTION

Figure 1:
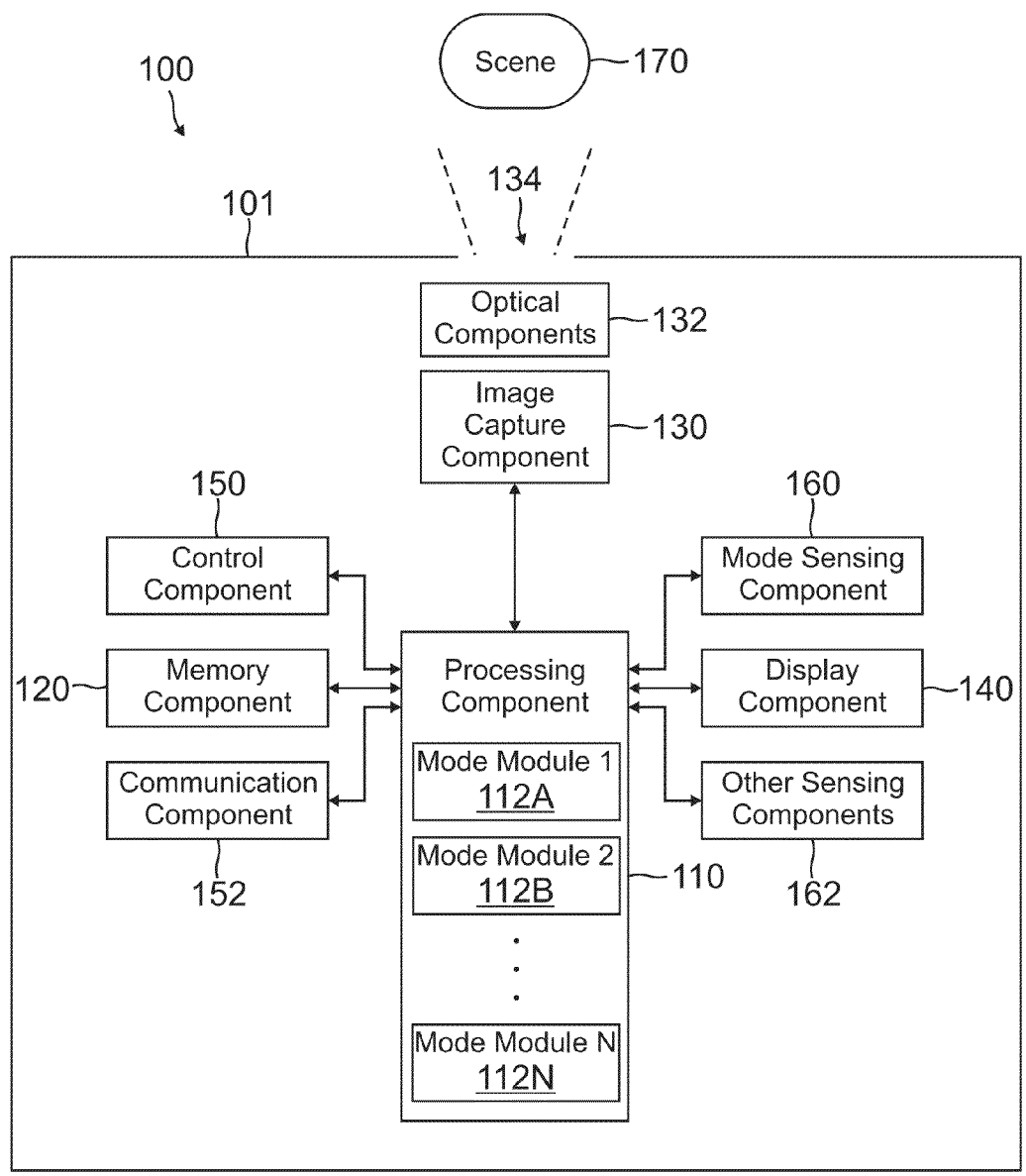
FIG. 1 illustrates a block diagram of an imaging system in accordance with an embodiment of the disclosure.

FIG. 1 illustrates a block diagram of an imaging system 100 in accordance with an embodiment of the disclosure. Imaging system 100 may be used to capture and process images in accordance with various techniques described herein. In one embodiment, various components of imaging system 100 may be provided in a housing 101, such as a housing of a camera or other system as shown. In another embodiment, one or more components of imaging system 100 may be implemented remotely from each other in a distributed fashion (e.g., networked or otherwise).

In one embodiment, imaging system 100 includes a processing component 110, a memory component 120, an image capture component 130, optical components 132 (e.g., one or more lenses configured to receive electromagnetic radiation through an aperture 134 in housing 101 and pass the electromagnetic radiation to image capture component 130), a display component 140, a control component 150, a communication component 152, a mode sensing component 160, and a sensing component 162.

In various embodiments, imaging system 100 may implemented as an imaging device, such as a camera, to capture images, for example, of a scene 170 (e.g., a field of view). Imaging system 100 may represent any type of camera system which, for example, detects electromagnetic radiation and provides representative data (e.g., one or more still images or video images). For example, imaging system 100 may represent a camera that is directed to detect one or more ranges of electromagnetic radiation and provide associated image data. Imaging system 100 may include a portable device and may be implemented, for example, as a handheld device and/or coupled, in other examples, to various types of vehicles (e.g., a land-based vehicle, a watercraft, an aircraft, a spacecraft, or other vehicle) or to various types of fixed locations (e.g., a home security mount, a campsite or outdoors mount, or other location) via one or more types of mounts. In still another example, imaging system 100 may be integrated as part of a non-mobile installation to provide images to be stored and/or displayed.

Processing component 110 may include, for example, a microprocessor, a single-core processor, a multi-core processor, a microcontroller, a logic device (e.g., a programmable logic device configured to perform processing operations), a digital signal processing (DSP) device, one or more memories for storing executable instructions (e.g., software, firmware, or other instructions), and/or or any other appropriate combination of processing device and/or memory to execute instructions to perform any of the various operations described herein. Processing component 110 is adapted to interface and communicate with components 120, 130, 140, 150, 160, and 162 to perform method and processing steps as described herein. Processing component 110 may include one or more mode modules 112A-112N for operating in one or more modes of operation (e.g., to operate in accordance with any of the various embodiments disclosed herein). In one embodiment, mode modules 112A-112N are adapted to define processing and/or display operations that may be embedded in processing component 110 or stored on memory component 120 for access and execution by processing component 110. In another aspect, processing component 110 may be adapted to perform various types of image processing algorithms as described herein.

In various embodiments, it should be appreciated that each mode module 112A-112N may be integrated in software and/or hardware as part of processing component 110, or code (e.g., software or configuration data) for each mode of operation associated with each mode module 112A-112N, which may be stored in memory component 120. Embodiments of mode modules 112A-112N (i.e., modes of operation) disclosed herein may be stored by a separate machine readable medium in a non-transitory manner (e.g., a memory, a hard drive, a compact disk, a digital video disk, or a flash memory) to be executed by a computer (e.g., logic or processor-based system) to perform various methods disclosed herein.

In one example, the machine readable medium may be portable and/or located separate from imaging system 100, with stored mode modules 112A-112N provided to imaging system 100 by coupling the machine readable medium to imaging system 100 and/or by imaging system 100 downloading (e.g., via a wired or wireless link) the mode modules 112A-112N from the machine readable medium (e.g., containing the non-transitory information). In various embodiments, as described herein, mode modules 112A-112N provide for improved camera processing techniques for real time applications, wherein a user or operator may change the mode of operation depending on a particular application, such as an off-road application, a maritime application, an aircraft application, a space application, or other application.

Memory component 120 includes, in one embodiment, one or more memory devices (e.g., one or more memories) to store data and information. The one or more memory devices may include various types of memory including volatile and non-volatile memory devices, such as RAM (Random Access Memory), ROM (Read-Only Memory), EEPROM (Electrically-Erasable Read-Only Memory), flash memory, or other types of memory. In one embodiment, processing component 110 is adapted to execute software stored in memory component 120 to perform various methods, processes, and modes of operations in manner as described herein.

Image capture component 130 includes, in one embodiment, one or more sensors (e.g., any type visible light, infrared, or other type of detector, including a detector implemented as part of a focal plane array) for capturing image signals representative of an image, of scene 170. In one embodiment, the sensors of image capture component 130 provide for representing (e.g., converting) a captured thermal image signal of scene 170 as digital data (e.g., via an analog-to-digital converter included as part of the sensor or separate from the sensor as part of imaging system 100).

Processing component 110 may be adapted to receive image signals from image capture component 130, process image signals (e.g., to provide processed image data), store image signals or image data in memory component 120, and/or retrieve stored image signals from memory component 120. Processing component 110 may be adapted to process image signals stored in memory component 120 to provide image data (e.g., captured and/or processed image data) to display component 140 for viewing by a user.

Display component 140 includes, in one embodiment, an image display device (e.g., a liquid crystal display (LCD)) or various other types of generally known video displays or monitors. Processing component 110 may be adapted to display image data and information on display component 140. Processing component 110 may be adapted to retrieve image data and information from memory component 120 and display any retrieved image data and information on display component 140. Display component 140 may include display electronics, which may be utilized by processing component 110 to display image data and information. Display component 140 may receive image data and information directly from image capture component 130 via processing component 110, or the image data and information may be transferred from memory component 120 via processing component 110.

In one embodiment, processing component 110 may initially process a captured thermal image (e.g., a thermal image frame) and present a processed image in one mode, corresponding to mode modules 112A-112N, and then upon user input to control component 150, processing component 110 may switch the current mode to a different mode for viewing the processed image on display component 140 in the different mode. This switching may be referred to as applying the camera processing techniques of mode modules 112A-112N for real time applications, wherein a user or operator may change the mode while viewing an image on display component 140 based on user input to control component 150. In various aspects, display component 140 may be remotely positioned, and processing component 110 may be adapted to remotely display image data and information on display component 140 via wired or wireless communication with display component 140, as described herein.

Control component 150 includes, in one embodiment, a user input and/or interface device having one or more user actuated components, such as one or more push buttons, slide bars, rotatable knobs or a keyboard, that are adapted to generate one or more user actuated input control signals. Control component 150 may be adapted to be integrated as part of display component 140 to operate as both a user input device and a display device, such as, for example, a touch screen device adapted to receive input signals from a user touching different parts of the display screen. Processing component 110 may be adapted to sense control input signals from control component 150 and respond to any sensed control input signals received therefrom.

Control component 150 may include, in one embodiment, a control panel unit (e.g., a wired or wireless handheld control unit) having one or more user-activated mechanisms (e.g., buttons, knobs, sliders, or others) adapted to interface with a user and receive user input control signals. In various embodiments, the one or more user-activated mechanisms of the control panel unit may be utilized to select between the various modes of operation, as described herein in reference to mode modules 112A-112N. In other embodiments, it should be appreciated that the control panel unit may be adapted to include one or more other user-activated mechanisms to provide various other control operations of imaging system 100, such as auto-focus, menu enable and selection, field of view (FoV), brightness, contrast, gain, offset, spatial, temporal, and/or various other features and/or parameters. In still other embodiments, a variable gain signal may be adjusted by the user or operator based on a selected mode of operation.

In another embodiment, control component 150 may include a graphical user interface (GUI), which may be integrated as part of display component 140 (e.g., a user actuated touch screen), having one or more images of the user-activated mechanisms (e.g., buttons, knobs, sliders, or others), which are adapted to interface with a user and receive user input control signals via the display component 140. As an example for one or more embodiments as discussed further herein, display component 140 and control component 150 may represent a smart phone, a tablet, a personal digital assistant (e.g., a wireless, mobile device), a laptop computer, a desktop computer, or other type of device.

Mode sensing component 160 includes, in one embodiment, an application sensor adapted to automatically sense a mode of operation, depending on the sensed application (e.g., intended use or implementation), and provide related information to processing component 110. In various embodiments, the application sensor may include a mechanical triggering mechanism (e.g., a clamp, clip, hook, switch, push-button, or others), an electronic triggering mechanism (e.g., an electronic switch, push-button, electrical signal, electrical connection, or others), an electro-mechanical triggering mechanism, an electro-magnetic triggering mechanism, or some combination thereof. For example for one or more embodiments, mode sensing component 160 senses a mode of operation corresponding to the imaging system's 100 intended application based on the type of mount (e.g., accessory or fixture) to which a user has coupled the imaging system 100 (e.g., image capture component 130). Alternatively, the mode of operation may be provided via control component 150 by a user of imaging system 100 (e.g., wirelessly via display component 140 having a touch screen or other user input representing control component 150).

Furthermore in accordance with one or more embodiments, a default mode of operation may be provided, such as for example when mode sensing component 160 does not sense a particular mode of operation (e.g., no mount sensed or user selection provided). For example, imaging system 100 may be used in a freeform mode (e.g., handheld with no mount) and the default mode of operation may be set to handheld operation, with the images provided wirelessly to a wireless display (e.g., another handheld device with a display, such as a smart phone, or to a vehicle's display).

Mode sensing component 160, in one embodiment, may include a mechanical locking mechanism adapted to secure the imaging system 100 to a vehicle or part thereof and may include a sensor adapted to provide a sensing signal to processing component 110 when the imaging system 100 is mounted and/or secured to the vehicle. Mode sensing component 160, in one embodiment, may be adapted to receive an electrical signal and/or sense an electrical connection type and/or mechanical mount type and provide a sensing signal to processing component 110. Alternatively or in addition, as discussed herein for one or more embodiments, a user may provide a user input via control component 150 (e.g., a wireless touch screen of display component 140) to designate the desired mode (e.g., application) of imaging system 100.

Processing component 110 may be adapted to communicate with mode sensing component 160 (e.g., by receiving sensor information from mode sensing component 160) and image capture component 130 (e.g., by receiving data and information from image capture component 130 and providing and/or receiving command, control, and/or other information to and/or from other components of imaging system 100).

In various embodiments, mode sensing component 160 may be adapted to provide data and information relating to system applications including a handheld implementation and/or coupling implementation associated with various types of vehicles (e.g., a land-based vehicle, a watercraft, an aircraft, a spacecraft, or other vehicle) or stationary applications (e.g., a fixed location, such as on a structure). In one embodiment, mode sensing component 160 may include communication devices that relay information to processing component 110 via wireless communication. For example, mode sensing component 160 may be adapted to receive and/or provide information through a satellite, through a local broadcast transmission (e.g., radio frequency), through a mobile or cellular network and/or through information beacons in an infrastructure (e.g., a transportation or highway information beacon infrastructure) or various other wired or wireless techniques (e.g., using various local area or wide area wireless standards).

In another embodiment, imaging system 100 may include one or more other types of sensing components 162, including environmental and/or operational sensors, depending on the sensed application or implementation, which provide information to processing component 110 (e.g., by receiving sensor information from each sensing component 162). In various embodiments, other sensing components 162 may be adapted to provide data and information related to environmental conditions, such as internal and/or external temperature conditions, lighting conditions (e.g., day, night, dusk, and/or dawn), humidity levels, specific weather conditions (e.g., sun, rain, and/or snow), distance (e.g., laser rangefinder), and/or whether a tunnel, a covered parking garage, or that some type of enclosure has been entered or exited. Accordingly, other sensing components 160 may include one or more conventional sensors as would be known by those skilled in the art for monitoring various conditions (e.g., environmental conditions) that may have an affect (e.g., on the image appearance) on the data provided by image capture component 130.

In some embodiments, other sensing components 162 may include devices that relay information to processing component 110 via wireless communication. For example, each sensing component 162 may be adapted to receive information from a satellite, through a local broadcast (e.g., radio frequency) transmission, through a mobile or cellular network and/or through information beacons in an infrastructure (e.g., a transportation or highway information beacon infrastructure) or various other wired or wireless techniques.

In various embodiments, components of imaging system 100 may be combined and/or implemented or not, as desired or depending on application requirements, with imaging system 100 representing various operational blocks of a system. For example, processing component 110 may be combined with memory component 120, image capture component 130, display component 140, and/or mode sensing component 160. In another example, processing component 110 may be combined with image capture component 130 with only certain operations of processing component 110 performed by circuitry (e.g., a processor, a microprocessor, a microcontroller, a logic device, or other circuitry) within image capture component 130. In still another example, control component 150 may be combined with one or more other components or be remotely connected to at least one other component, such as processing component 110, via a wired or wireless control device so as to provide control signals thereto.

In one embodiment, communication component 152 may be implemented as a network interface component (NIC) adapted for communication with a network including other devices in the network. In various embodiments, communication component 152 may include a wireless communication component, such as a wireless local area network (WLAN) component based on the IEEE 802.11 standards, a wireless broadband component, mobile cellular component, a wireless satellite component, or various other types of wireless communication components including radio frequency (RF), microwave frequency (MWF), and/or infrared frequency (IRF) components adapted for communication with a network. As such, communication component 152 may include an antenna coupled thereto for wireless communication purposes. In other embodiments, the communication component 152 may be adapted to interface with a DSL (e.g., Digital Subscriber Line) modem, a PSTN (Public Switched Telephone Network) modem, an Ethernet device, and/or various other types of wired and/or wireless network communication devices adapted for communication with a network.

In various embodiments, a network may be implemented as a single network or a combination of multiple networks. For example, in various embodiments, the network may include the Internet and/or one or more intranets, landline networks, wireless networks, and/or other appropriate types of communication networks. In another example, the network may include a wireless telecommunications network (e.g., cellular phone network) adapted to communicate with other communication networks, such as the Internet. As such, in various embodiments, the imaging system 100 may be associated with a particular network link such as for example a URL (Uniform Resource Locator), an IP (Internet Protocol) address, and/or a mobile phone number.

Figure 2:
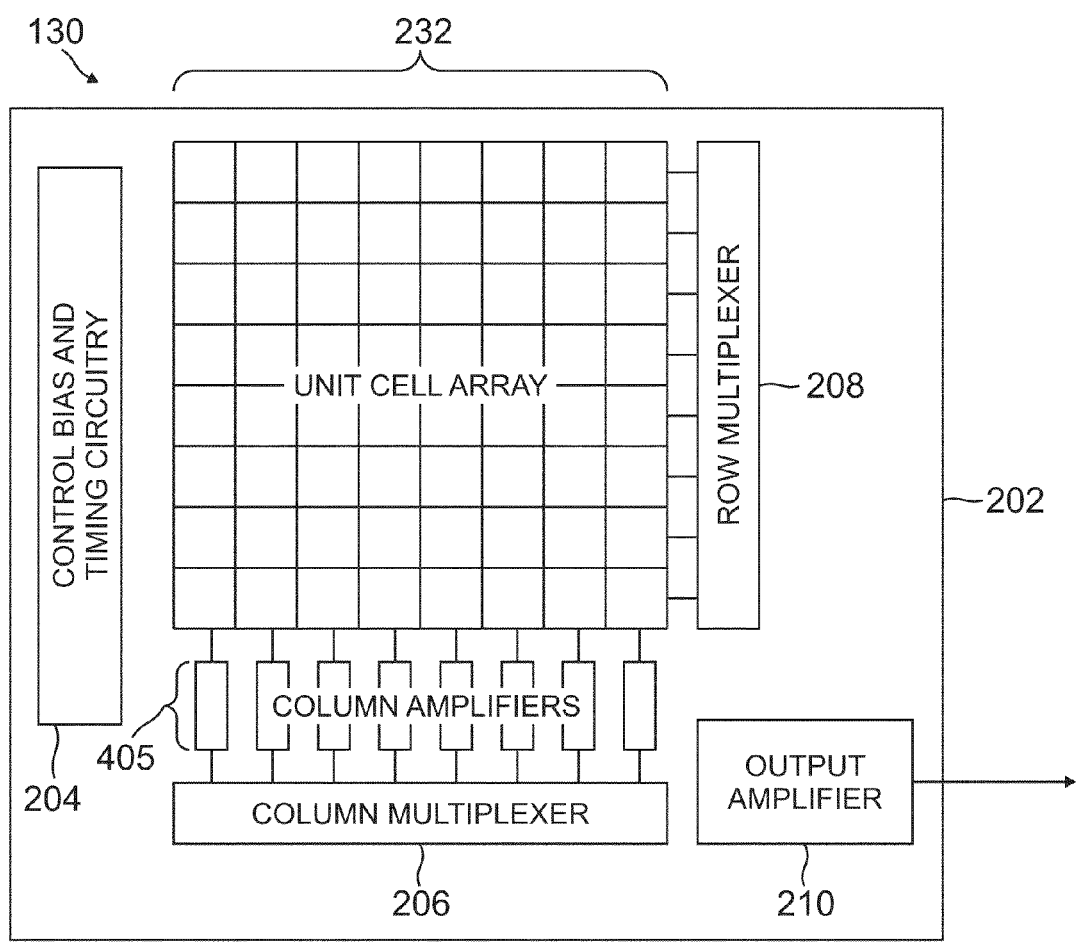
FIG. 2 illustrates a block diagram of an image capture component in accordance with an embodiment of the disclosure.

FIG. 2 illustrates a block diagram of image capture component 130 in accordance with an embodiment of the disclosure. In this illustrated embodiment, image capture component 130 is an FPA including an array of unit cells 232 and a read out integrated circuit (ROIC) 202. Each unit cell 232 may be provided with an infrared detector (e.g., a microbolometer or other appropriate sensor) and associated circuitry to provide image data for a pixel of a captured thermal image. In this regard, time-multiplexed electrical signals may be provided by the unit cells 232 to ROIC 202.

ROIC 202 includes bias generation and timing control circuitry 204, column amplifiers 205, a column multiplexer 206, a row multiplexer 208, and an output amplifier 210. Images captured by infrared sensors 232 may be provided by output amplifier 210 to processing component 110 and/or any other appropriate components to perform various processing techniques described herein. Although an 8 by 8 array is shown in FIG. 2, any desired array configuration may be used in other embodiments. Further descriptions of ROICs and infrared sensors (e.g., microbolometer circuits) may be found in U.S. Pat. No. 6,028,309 issued Feb. 22, 2000, which is incorporated herein by reference in its entirety.

Figure 3:
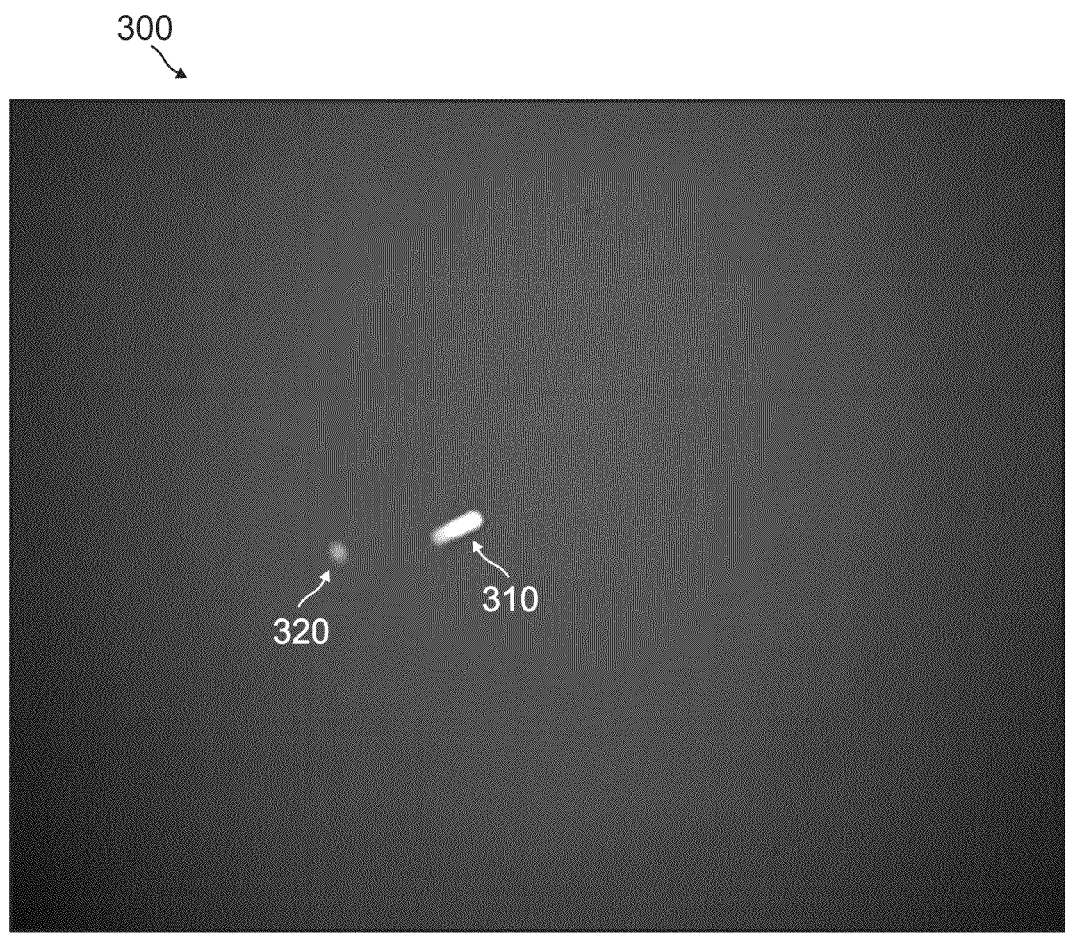
FIG. 3 illustrates a captured thermal image exhibiting burn-in blemishes in accordance with an embodiment of the disclosure.

FIG. 3 illustrates a captured thermal image 300 exhibiting burn-in blemishes in accordance with an embodiment of the disclosure. A blemish 310 was introduced by a four minute exposure to the sun and appears as a streak (e.g., movement of the sun within the field of view in this example resulted in a streak rather than a circular artifact). A blemish 320 was introduced by a shorter ten second exposure to the sun and appears as a hot spot.

Figure 4:
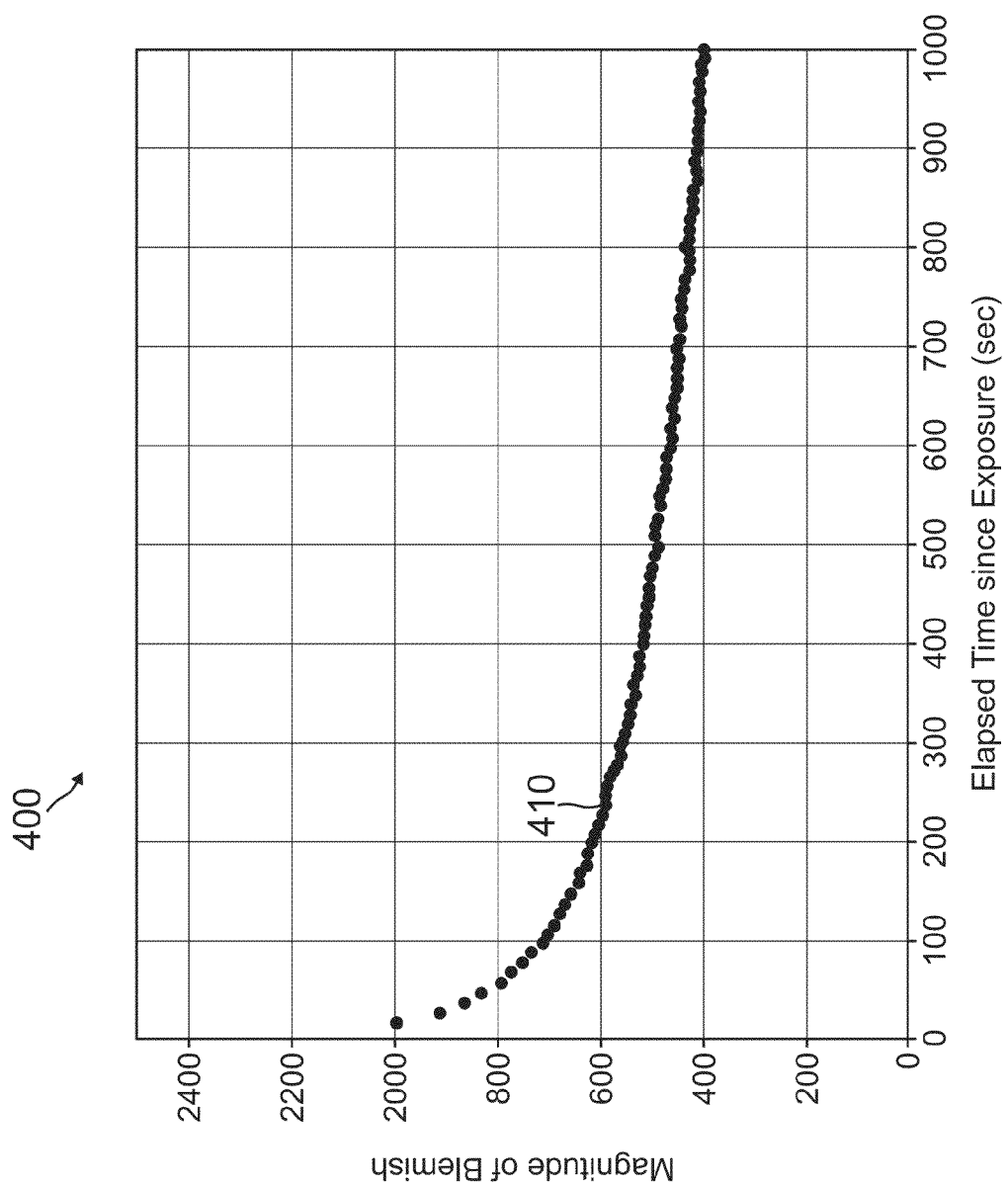
FIG. 4 illustrates an example graph of the decay of an unmitigated burn-in blemish in accordance with an embodiment of the disclosure.

FIG. 4 illustrates an example graph 400 of the decay of an unmitigated (e.g., uncompensated) burn-in blemish (e.g., blemish 310 or 320 in one example) in accordance with an embodiment of the disclosure. In this regard, the decay refers to the decaying magnitude of a blemish in successively captured thermal images. In graph 400, a plot 410 identifies the magnitude of the blemish over time since exposure to a high thermal energy source as measured relative to a nearby, unexposed portion of a detector array. As shown by plot 410, the blemish decays in a non-linear manner. In particular, the blemish in this case decays at a relatively fast rate shortly after the blemish is introduced. However, the decay rate quickly falls and continues to reduce in a more gradual manner as time elapses.

FIGS. 5A-F illustrate various processes that may be performed to detect burn-in events and mitigate blemishes such as those identified in FIGS. 3-4 caused by solar burn-in events. The described techniques may also be applied to other burn-in events and/or other types of blemishes where appropriate.

In various embodiments, imaging system 100 may be configured to perform the various operations of FIGS. 5A-F. For example, program code may be stored in memory component 120 or other appropriate machine readable mediums (e.g., media) to instruct processing component 110, image capture component 130, and/or other aspects of imaging system 100 to perform such operations.

Although FIGS. 5A-F will be described primarily with regard to imaging system 100, the various described operations may be performed by integrated, distributed, and/or networked systems where appropriate. For example, in one embodiment, processing component 110 may be implemented as part of another system in communication with image capture component 130.

Figure 5A:
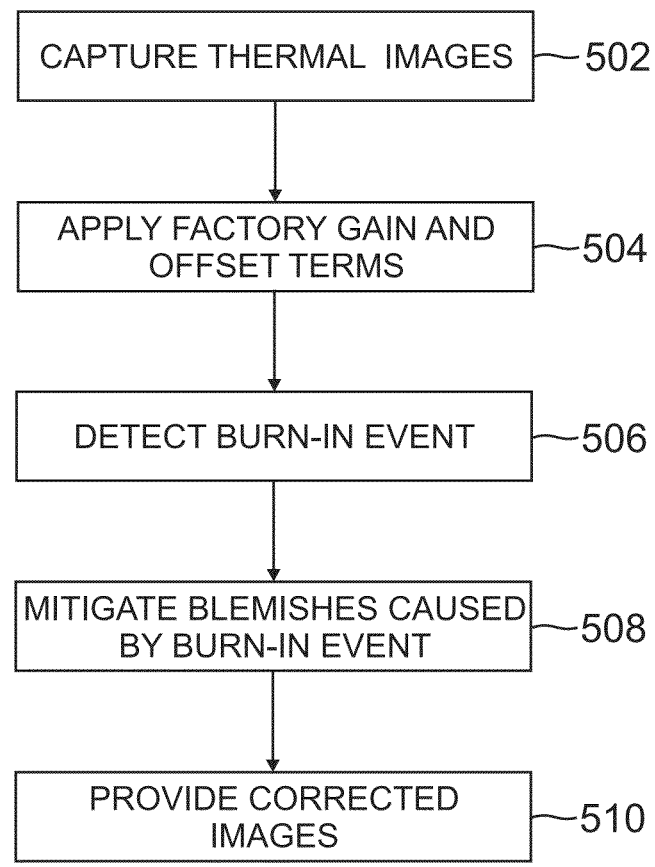
FIG. 5A illustrates a process of providing corrected thermal images in accordance with an embodiment of the disclosure.

FIG. 5A illustrates a process of providing corrected thermal images in accordance with an embodiment of the disclosure. In this regard, FIG. 5A identifies an overall process, and particular steps of FIG. 5A may be performed in accordance with the various processes set forth in FIGS. 5B-F.

In block 502, image capture component 130 captures thermal images from scene 170. In block 504, factory gain and offset terms are applied to the captured thermal images to compensate for gain and offset differences, respectively, between the various unit cells 232 of image capture component 130.

In block 506, imaging system 100 detects a burn-in event. In this regard, scene 170 may include one or more high intensity thermal energy sources that cause one or more portions of image capture component 130 (e.g., the FPA or others) to saturate. Such portions may include, for example, one or more unit cells 232 (e.g., infrared detectors, associated circuitry, and/or other parts thereof), ROIC 202, analog-to-digital circuitry, digital-to-analog circuitry, buffers, amplifiers, and/or others. If such thermal energy sources are sufficiently hot, a burn-in event may occur wherein one or more portions of the image capture component 130 highly saturated even as additional thermal images are captured after the energy source is removed from scene 170.

FIGS. 5B-D illustrate several processes that may be performed in block 506 to detect possible burn-in events in accordance with embodiments of the disclosure. Referring now to FIG. 5B, in block 520, imaging system 100 identifies pixels that are saturated in one or more of the captured thermal images. In this regard, image capture component 130 may be configured to detect infrared radiation over a given range of intensities for each pixel of a resulting image. A measurement of the detected radiation may be provided for each pixel in the form of, for example, analog voltage, analog current, digital count, and/or other appropriate indicators. When portions of image capture component 130 saturate, the associated pixels will typically exhibit maximum measurement values. In various embodiments, not all saturated pixels will necessarily have the exact same maximum measurement value when saturated under saturation conditions. In such embodiments, saturation may be determined to occur for each pixel having a measurement value that exceeds a threshold (e.g., a minimum saturation value for all the pixels of the array, a per-pixel threshold, or other threshold as appropriate for particular applications).

Accordingly, in block 520, any pixels with measured values that meet a saturation threshold are identified by imaging system 100 as saturated pixels. In block 522, the identified saturated pixels are designated as being associated with a burn-in event. In this regard, it is conservatively assumed in the process of FIG. 5B that any pixel meeting the saturation threshold value may have experienced a burn-in event and that such pixels may exhibit residual blemishes in successively captured thermal images. As a result, by identifying saturated pixels, a burn-in event is detected for such pixels.

In some embodiments, the approach of FIG. 5B may identify both mildly saturated pixels and highly saturated pixels as all being caused by a burn-in event. For example, in some embodiments, a burn-in event may occur by imaging the sun wherein image capture component 130 may receive 100 times or even 1000 times the energy needed to reach saturation. In such a case, saturated portions of image capture component 130 may experience long lasting spurious offsets (e.g., a burn-in condition) which may be exhibited as blemishes in pixels that persist in successively captured thermal images. Other mild saturation events (e.g., where energy levels close to the saturation level are received) may not result in long lasting offsets but may nevertheless be identified as burn-in events in the process of FIG. 53. Accordingly, by using a relatively low threshold for burn-in events, the process of FIG. 5B provides a highly inclusive approach to identify a large number of potential burn-in events. In some embodiments, the process of FIG. 5B may be performed prior to other processes to perform a preliminary detection of potential burn-in events.

FIG. 5C illustrates another process that may be performed in block 506 to detect possible burn-in events in accordance with an embodiment of the disclosure. In block 530, imaging system 100 performs a FFC process in which a first set of FFC terms are determined for pixels of a captured thermal image. In block 532, imaging system 100 performs a second FFC process in which a second set of FFC terms are determined for pixels of another captured thermal image. Such FFC processes may be performed using various shutter-based and/or shutterless FFC techniques.

In block 534, imaging system 100 compares the FFC terms from the first and second FFC processes. In block 536, imaging system 100 determines an average change in the values of the FFC terms. In this regard, if no burn-in event has occurred, it may be expected that the first and second FFC terms for a given pixel may vary slightly, but that such changes will be bounded by a relatively small range. However, if a burn-in event has occurred during the time elapsing between blocks 530 and 532, it may be expected that the first and second FFC terms for a pixel evidencing a blemish caused by a burn-in event will exhibit a large difference that strongly diverges from the average change in the first and second FFC terms for all pixels (e.g., a difference that is greater than a threshold amount). Accordingly, pixels exhibiting large differences are identified (block 538) and are designated as being associated with a burn-in event (block 540). As a result, a burn-in event is detected for such pixels.

FIG. 5D illustrates yet another process that may be performed in block 506 to detect possible burn-in events in accordance with an embodiment of the disclosure. In one embodiment, the previously-described process of FIG. 5B may be performed prior to the process of FIG. 5D to perform a preliminary detection of potential burn-in events which are subsequently checked by the process of FIG. 5D to determine whether identified saturated pixels remain saturated when responsivity of imaging system 100 is reduced. In another embodiment, the process of FIG. 5B may not be performed. In block 550, imaging system 100 intentionally reduces the responsivity of image capture component 130 (e.g., by a factor of ten in one embodiment, however other factors are also contemplated). This may be performed, for example, by temporarily adjusting the integration time, bias level, f/#, and/or other parameters of image capture component 130 affecting responsivity.

In block 552, imaging system 100 captures a thermal image with the reduced responsivity. In block 554, imaging system 100 identifies any pixels of the captured thermal image that remain saturated (e.g., despite the reduced responsivity settings). In block 556, any identified saturated pixels are designated as being associated with a burn-in event.

Before responsivity is reduced in block 550, it may be unknown whether a given pixel is only mildly saturated (e.g., where image capture component 130 has received thermal energy close to the saturation level) or highly saturated (e.g., where image capture component 130 has received thermal energy substantially higher than the saturation level). Accordingly, by identifying saturated pixels based on a thermal image captured with reduced responsivity (blocks 552 and 554), the process of FIG. 5D effectively filters out mildly saturated pixels by not detecting those pixels which do not exhibit saturation in the temporarily reduced responsivity of image capture component 130.

Figure 5F:
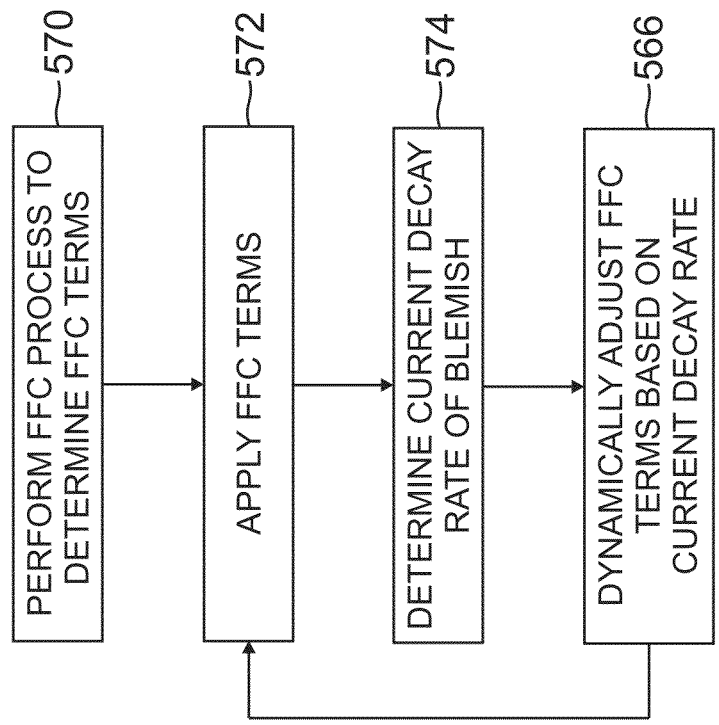
FIGS. 5E-F illustrate several processes of mitigating blemishes caused by burn-in events in accordance with embodiments of the disclosure.
Figure 5E:
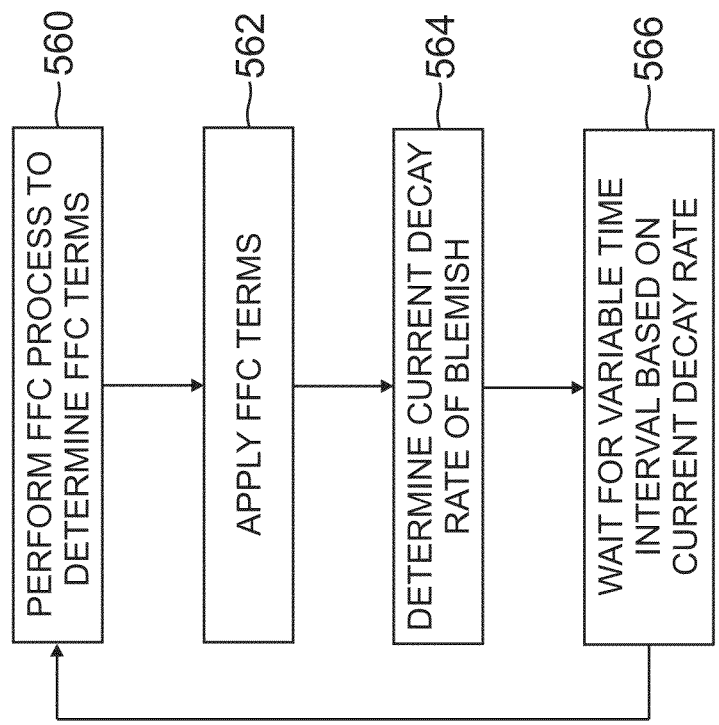

Returning to FIG. 5A, in block 508, imaging system 100 mitigates blemishes for pixels associated with burn-in events (e.g., detected in block 506). FIGS. 5E-F illustrate several processes that may be performed in block 508 to mitigate such detected blemishes in accordance with embodiments of the disclosure.

In various embodiments, the processes of FIGS. 5E-F may provide FFC terms in a manner that differs from conventional FFC processes. The FFC terms used in FIGS. 5E-F may be determined and/or updated at variable rates that substantially correspond to changing decay rates of blemishes associated with burn-in events.

As discussed, such blemishes may decay in a non-linear manner. In various embodiments, imaging system 100 may be implemented to determine the decay rates of blemishes as a function of elapsed time following a burn-in event. In one embodiment, such information may be provided by one or more lookup tables, databases, mathematical functions, and/or other information stored, for example, in memory component 120. In another embodiment, imaging system 100 may determine the decay rates of blemishes in real time based on repeated FFC processes. For example, FFC terms determined for different FFC processes performed on saturated unit cells may be used by processing component 110 to determine the magnitude of the blemishes at different times and thus calculate rates of decay.

Referring now to FIG. 5E, in block 560, imaging system 100 performs a FFC process in which a set of FFC terms are determined for pixels of captured thermal images. In various embodiments, the FFC process of block 560 may be performed instead of, in addition to, or may be the same as the FFC processes of blocks 530 and 532.

In block 562, imaging system 100 applies the FFC terms to a captured thermal image to provide a corrected thermal image. In block 564, imaging system 100 determines the current decay rate of the blemishes in the captured thermal image. As discussed, the current decay rate may be determined, for example, based on decay rate information stored by imaging system 100 or a comparison of the FFC terms to previously determined FFC terms (e.g., determined in a previous iteration of block 530, 532, and/or block 560).

In block 566, imaging system 100 waits for a variable time interval before returning to block 560 to perform another FFC process. In this regard, the variable time interval is based on the current blemish decay rate (e.g., determined in block 564). In this regard, if the current blemish decay rate is high (e.g., if the burn-in event occurred relatively recently), then the time interval may be extremely short. Conversely, if the current blemish decay rate is low (e.g., if significant time has passed since the burn-in event occurred), then the time interval may be significantly longer.

By performing FFC processes (e.g., shutterless or shutter-based processes) at variable time intervals in the manner of FIG. 5E, imaging system 100 may mitigate the effects of burn-in induced blemishes in a manner that significantly improves on conventional static FFC techniques. For example, by performing FFC processes frequently while decay rates are high, FFC terms can be frequently changed. This can significantly reduce the occurrence of inverse/negative dark blemishes due to FFC overcompensation associated with conventional static FFC techniques. Conversely, by performing FFC processes less frequently while decay rates are low, fewer system resources are used, fewer interruptions may occur, and system component lifetimes may be extended (e.g., when shutter-based FFC processes are used, the shutter may be used less frequently).

Figure 6:
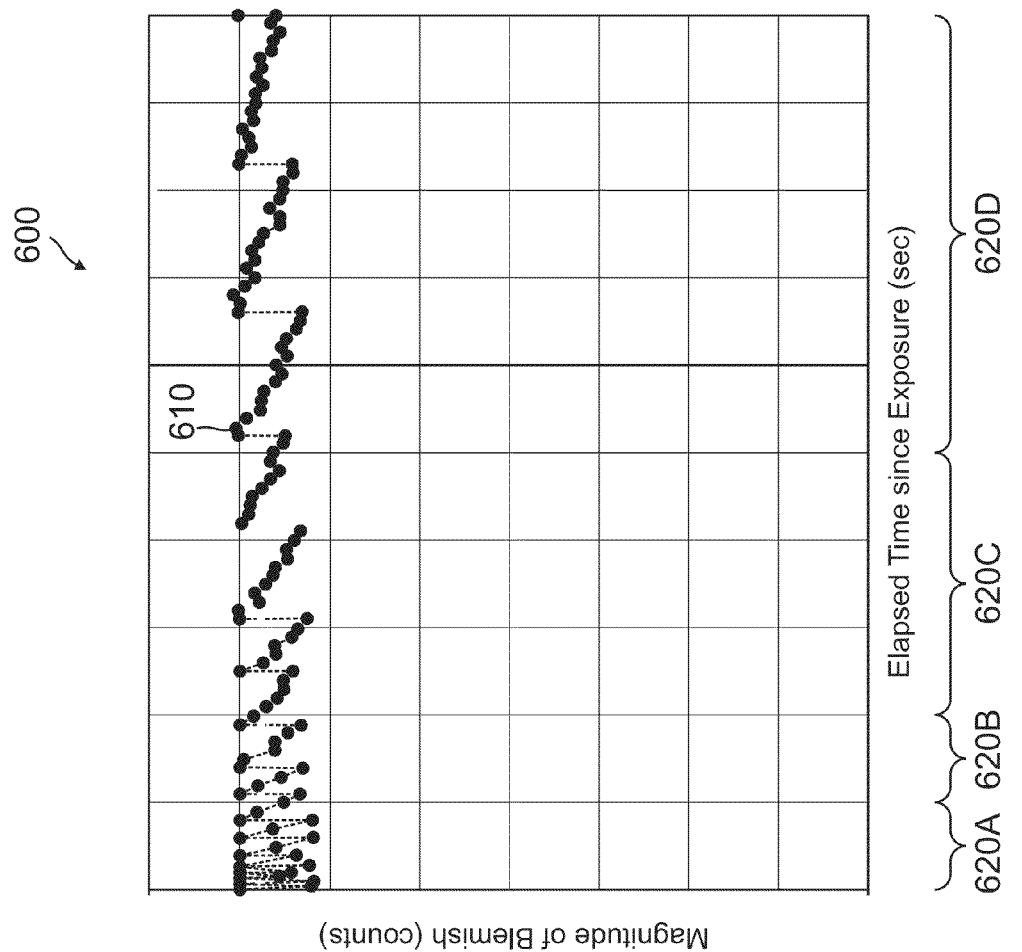
FIG. 6 illustrates an example graph of the magnitude of a blemish evident in corrected thermal images when mitigated by the process of FIG. 5E in accordance with an embodiment of the disclosure.

FIG. 6 illustrates an example graph of the magnitude of a blemish evident in corrected thermal images when mitigated by the process of FIG. 5E in accordance with an embodiment of the disclosure. In particular, a plot 610 identifies the magnitude of the blemish evident in corrected thermal images over time following a burn-in event. Multiple FFC processes (e.g., corresponding to block 560) are performed at varying intervals, with the FFC processes occurring at approximately the times at which the blemish magnitude returns to a zero value.

As shown in FIG. 6, FFC processes are performed at increasingly larger intervals over time. For example, over time 620A, a large number of FFC processes are rapidly performed (e.g., corresponding to a large number of iterations of the process of FIG. 5E). Over times 620B, 6200, and 620D, the frequency of the FFC processes continues to decrease. However, despite the change in frequency, the blemish magnitude remains well controlled within a limited range over the entire plot 610.

Referring now to FIG. 5F, blocks 570-574 may be performed in substantially the same manner as described for blocks 560-564 of FIG. 5E. In block 576, imaging system 100 dynamically adjusts the FFC terms based on the current blemish decay rate (e.g., determined in block 574). In this regard, the previously determined FFC terms may be adjusted in real time to compensate for changes in blemish magnitude over time, but without performing a further FFC process (e.g., FFC terms from the FFC process of block 570 may be modified without actually calculating entirely new FFC terms).

In one embodiment, the FFC terms may be modified based on information concerning known decay rates of blemishes as a function of elapsed time provided by imaging system 100 as previously discussed. In another embodiment, the modified FFC terms may be extrapolated based on known changes in FFC terms that have occurred in response to previous FFC processes. For example, modified FFC terms may be extrapolated linearly based on changes in FFC terms associated with two or more previous FFC processes. As another example, modified FFC terms may be extrapolated linearly as described, but based on the rate of change at two or more previous FFC processes (e.g., linear coefficients may be used corresponding to dynamic slopes as a function of time).

As another example, modified FFC terms may be extrapolated from an exponential fit to changes in FFC terms associated with two or more previous FFC processes. As another example, modified FFC terms may be extrapolated exponentially as described, but based on the rate of change at two or more previous FFC processes (e.g., exponential coefficients may be used corresponding to dynamic slopes as a function of time).

Following block 576, the modified (e.g., adjusted) FFC terms are applied (block 572) in a further iteration of blocks 572-576.

Figure 7:
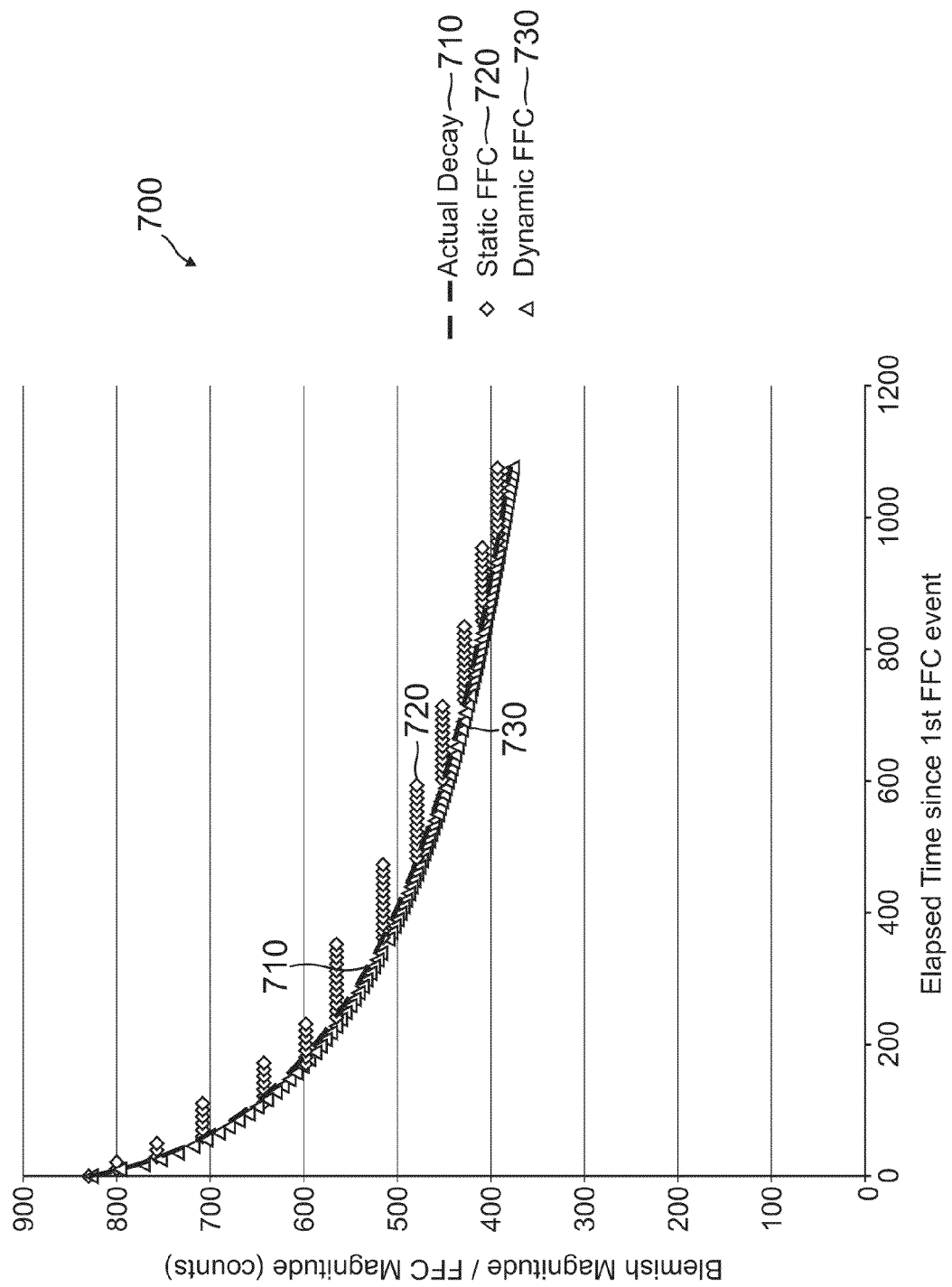
FIG. 7 illustrates an example graph of the decay of a burn-in blemish while the process of FIG. 5F is performed in accordance with an embodiment of the disclosure.

FIG. 7 illustrates an example graph of the decay of a burn-in blemish while the process of FIG. 5F is performed in accordance with an embodiment of the disclosure. In FIG. 7, a plot 710 identifies the actual decay of a blemish over time following a burn-in event. A plot 720 identifies the mitigation provided by FFC terms determined by a conventional static FFC process to compensate for the blemish of plot 710. A plot 730 identifies the mitigation provided by FFC terms that are adjusted in real time in accordance with the process of FIG. 5F to compensate for the blemish of plot 710.

As shown in FIG. 7, the conventional FFC terms of plot 720 quickly become stale shortly after they are calculated which may result in significant overcompensation of the blemish, particularly when the decay rate is high (e.g., shortly after the burn-in event). In contrast, the real time adjusted FFC terms of plot 730 are updated very rapidly and substantially track the blemish of plot 710 during both high and low decay rates.

Figure 8:
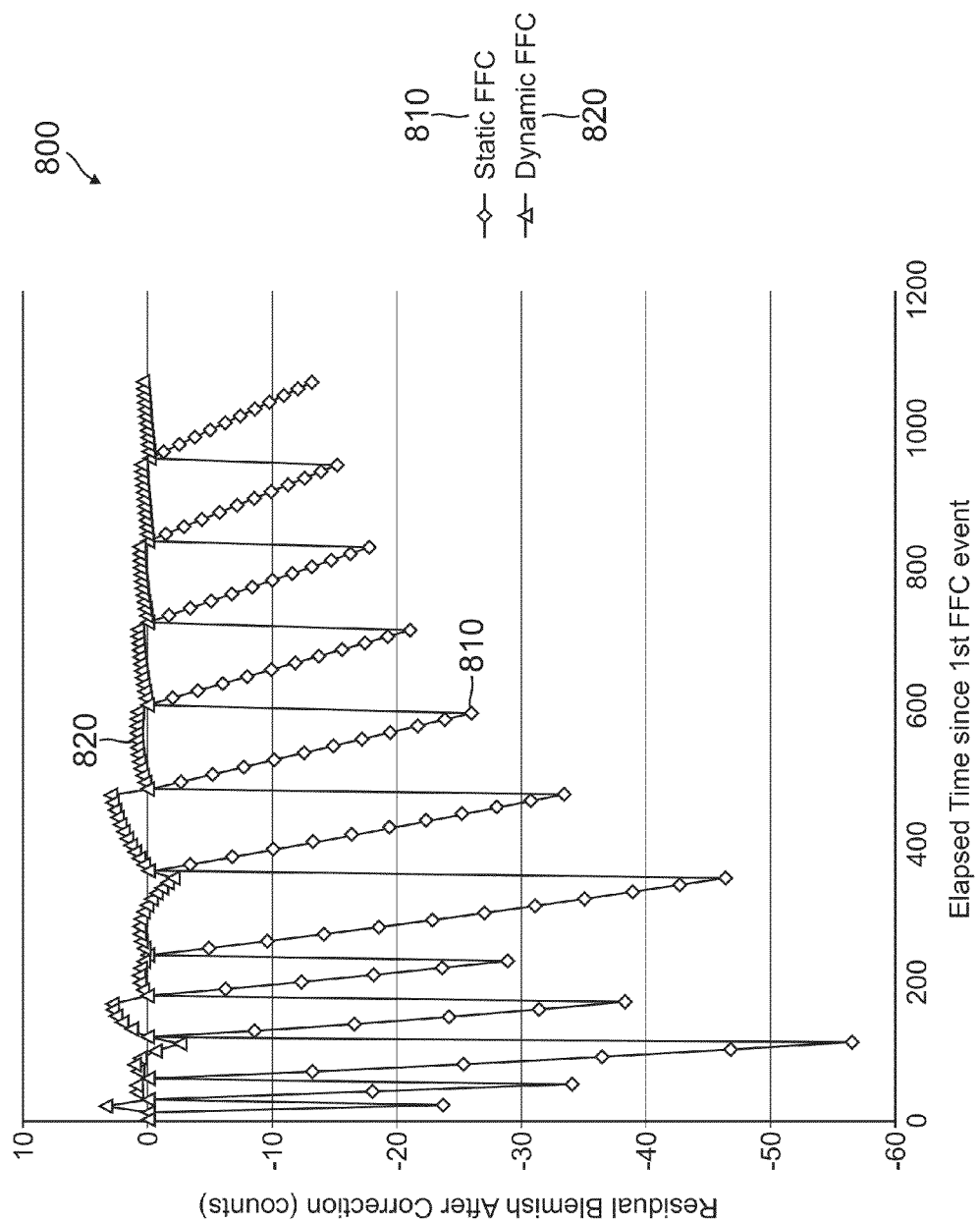
FIG. 8 illustrates an example graph of the magnitude of a blemish evident in corrected thermal images when mitigated by conventional periodic fixed rate FFC techniques in comparison with the process of FIG. 5F in accordance with an embodiment of the disclosure.

FIG. 8 illustrates an example graph of the magnitude of a blemish evident in corrected thermal images when mitigated by conventional periodic fixed rate FFC techniques in comparison with the process of FIG. 5F in accordance with an embodiment of the disclosure. In particular, a plot 810 identifies the magnitude of the blemish evident in corrected thermal images provided by conventional periodic fixed rate FFC techniques over time following a burn-in event. A plot 820 identifies the magnitude of the blemish evident in corrected thermal images provided by the process of FIG. 5F over time following a burn-in event.

As indicated by plot 810, blemishes of very large magnitude appear between conventional periodic FFC processes, particularly when the decay rate is high (e.g., shortly after the burn-in event). In contrast, plot 820 exhibits very small blemishes with magnitudes that remain well controlled within a limited range over the entire plot 820.

The processes of FIGS. 5E-F may each be performed in an iterative fashion as shown until, for example, the magnitude of the blemishes fall below a particular threshold, a maximum decay time is reached, a maximum number of iterations have been performed, and/or other criteria are met as appropriate for particular implementations. Moreover, the processes of FIGS. 5E-F may continue while imaging system 100 provides the corrected images in block 510 of FIG. 5A. In this regard, as the blemishes continue to decay, imaging system 100 may continue to provide newly corrected images based on the changing FFC terms and corrected images provided by the processes of FIGS. 5E-F.

Where applicable, the various components set forth herein can be combined into composite components and/or separated into sub-components without departing from the spirit of the present invention. Similarly, where applicable, the ordering of various steps described herein can be changed, combined into composite steps, and/or separated into sub-steps to provide features described herein.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A method comprising:
   detecting a burn-in event that causes thermal images captured by a focal plane array (FPA) to exhibit a blemish, wherein the detecting comprises:
   performing a first flat field correction (FFC) process to determine first FFC terms,
   performing a second FFC process to determine second FFC terms,
   comparing the first and second FFC terms,
   identifying, based on the comparing, corresponding ones of the first and second FFC terms that exhibit differences greater than a threshold amount,
   identifying one or more pixels corresponding to the identified first and second FFC terms, and
   associating the identified pixels with the burn-in event; and
   mitigating the blemish in the thermal images.

2. A method comprising:
   detecting a burn-in event that causes thermal images captured by a focal plane array (FPA) to exhibit a blemish; and
   mitigating the blemish in the thermal images, wherein the mitigating comprises:
   performing a flat field correction (FFC) process to determine FFC terms,
   applying the FFC terms to one of the thermal images to substantially remove the blemish,
   determining a current decay rate of the blemish,
   adjusting the FFC terms based on the current decay rate without performing an additional FFC process, and
   repeating the applying, determining, and adjusting to substantially remove the blemish from additional thermal images using different FFC terms as the blemish decays.

3. The method of claim 2, wherein the detecting comprises:
   capturing one of the thermal images by the FPA;
   identifying one or more saturated pixels of the thermal image; and
   associating the identified pixels with the burn-in event.

4. The method of claim 2, wherein the detecting comprises:
   reducing responsivity of the FPA;
   capturing one of the thermal images while the responsivity is reduced;
   identifying one or more saturated pixels of the thermal image; and
   associating the identified pixels with the burn-in event.

5. The method of claim 2, wherein the detecting comprises:
   capturing a first one of the thermal images by the FPA; and
   if one or more saturated pixels are present in the first thermal image, performing a further detection by:
   reducing responsivity of the FPA,
   capturing a second one of the thermal images while the responsivity is reduced,
   identifying one or more pixels of the second thermal image that remain saturated, and
   associating the identified pixels of the second thermal image with the burn-in event.

6. The method of claim 1, wherein the mitigating comprises:
   performing a third FFC process to determine third FFC terms;
   applying the third FFC terms to one of the thermal images to substantially remove the blemish;
   determining a current decay rate of the blemish;
   waiting for a time interval based on the current decay rate; and
   repeating the performing, applying, determining, and waiting to substantially remove the blemish from additional thermal images using different FFC terms as the blemish decays.

7. The method of claim 1, wherein the mitigating comprises:
 performing a third FFC process to determine third FFC terms;
 applying the third FFC terms to one of the thermal images to substantially remove the blemish;
 determining a current decay rate of the blemish;
 adjusting the third FFC terms based on the current decay rate without performing an additional FFC process; and
 repeating the applying, determining, and adjusting to substantially remove the blemish from additional thermal images using different FFC terms as the blemish decays.

8. The method of claim 1, wherein the blemish persists over multiple ones of the thermal images and decays at a varying rate in a non-linear manner.

9. The method of claim 1, wherein the burn-in event comprises receiving solar radiation at the FPA.

10. The method of claim 1, wherein the burn-in event causes a unit cell of the FPA to saturate.

11. The method of claim 1, wherein the method is performed by a processor remote from the FPA.

12. A thermal imaging system comprising:
 a focal plane array (FPA) adapted to capture thermal images; and
 a processor adapted to:
  detect a burn-in event that causes the thermal images to exhibit a blemish, wherein the processor is adapted to operate as follows to detect the burn-in event:
   perform a first flat field correction (FFC) process to determine first FFC terms,
   perform a second FFC process to determine second FFC terms,
   compare the first and second FFC terms,
   identify, based on the compare, corresponding ones of the first and second FFC terms that exhibit differences greater than a threshold amount,
   identify one or more pixels corresponding to the identified first and second FFC terms, and
   associate the identified pixels with the burn-in event; and
  mitigate the blemish in the thermal images.

13. A thermal imaging system comprising:
 a focal plane array (FPA) adapted to capture thermal images; and
 a processor adapted to:
  detect a burn-in event that causes the thermal images to exhibit a blemish, and
  mitigate the blemish in the thermal images, wherein the processor is adapted to operate as follows to mitigate the blemish:
   perform a flat field correction (FFC) process to determine FFC terms,
   apply the FFC terms to one of the thermal images to substantially remove the blemish,
   determine a current decay rate of the blemish,
   adjust the FFC terms based on the current decay rate without performing an additional FFC process, and
   repeat the apply, determine, and adjust operations to substantially remove the blemish from additional thermal images using different FFC terms as the blemish decays.

14. The thermal imaging system of claim 13, wherein the processor is adapted to operate as follows to detect the burn-in event:
 identify one or more saturated pixels of one of the thermal images; and
 associate the identified pixels with the burn-in event.

15. The thermal imaging system of claim 13, wherein the processor is adapted to operate as follows to detect the burn-in event:
 reduce responsivity of the FPA;
 identify one or more saturated pixels of one of the thermal images captured while the responsivity is reduced; and
 associate the identified pixels with the burn-in event.

16. The thermal imaging system of claim 13, wherein the processor is adapted to operate as follows to detect the burn-in event:
 capture a first one of the thermal images by the FPA; and
 if one or more saturated pixels are present in the first thermal image:
  reduce responsivity of the FPA,
  capture a second one of the thermal images while the responsivity is reduced,
  identify one or more pixels of the second thermal image that remain saturated, and
  associate the identified pixels of the second thermal image with the burn-in event.

17. The thermal imaging system of claim 12, wherein the processor is adapted to operate as follows to mitigate the blemish:
 perform a third FFC process to determine third FFC terms;
 apply the third FFC terms to one of the thermal images to substantially remove the blemish;
 determine a current decay rate of the blemish;
 wait for a time interval based on the current decay rate; and
 repeat the perform, apply, determine, and wait operations to substantially remove the blemish from additional thermal images using different FFC terms as the blemish decays.

18. The thermal imaging system of claim 12, wherein the processor is adapted to operate as follows to mitigate the blemish:
 perform a third FFC process to determine third FFC terms;
 apply the third FFC terms to one of the thermal images to substantially remove the blemish;
 determine a current decay rate of the blemish;
 adjust the third FFC terms based on the current decay rate without performing an additional FFC process; and
 repeat the apply, determine, and adjust operations to substantially remove the blemish from additional thermal images using different FFC terms as the blemish decays.

19. The thermal imaging system of claim 12, wherein the blemish persists over multiple ones of the thermal images and decays at a varying rate in a non-linear manner.

20. The thermal imaging system of claim 12, wherein the burn-in event comprises receipt of solar radiation at the FPA.

21. The thermal imaging system of claim 12, wherein the burn-in event causes a unit cell of the FPA to saturate.

22. The thermal imaging system of claim 12, wherein the processor is remote from the FPA.

* * * * *